United States Patent [19]
Ohno et al.

[11] Patent Number: 5,164,336
[45] Date of Patent: Nov. 17, 1992

[54] METHOD OF CONNECTING TAB TAPE TO SEMICONDUCTOR CHIP, AND BUMP SHEET AND BUMPED TAPE USED IN THE METHOD

[75] Inventors: Yasuhide Ohno; Tadakatsu Maruyama; Hiroaki Otsuka; Hiroyuki Tanahashi, all of Kawasaki, Japan

[73] Assignee: Nippon Steel Corporation, Japan

[21] Appl. No.: 578,491

[22] Filed: Sep. 6, 1990

[30] Foreign Application Priority Data

Sep. 11, 1989 [JP] Japan ................... 1-234915
Sep. 11, 1989 [JP] Japan ................... 1-234916
Sep. 11, 1989 [JP] Japan ................... 1-234917

[51] Int. Cl.⁵ .......................... H01L 23/48
[52] U.S. Cl. ................... 437/220; 437/206; 437/182; 437/183; 228/180.2
[58] Field of Search ............... 437/182, 183, 209, 211, 437/212, 206, 220; 228/246, 180.2

[56] References Cited

U.S. PATENT DOCUMENTS 4,784,972 11/1988 Hatada ................... 437/209

FOREIGN PATENT DOCUMENTS

| | | | |
|---|---|---|---|
| 57-18347 | 1/1982 | Japan | 437/209 |
| 59-202643 | 11/1984 | Japan | 437/209 |
| 60-52045 | 3/1985 | Japan | 437/183 |
| 63-288032 | 11/1988 | Japan | 437/209 |
| 63-291427 | 11/1988 | Japan | 437/209 |
| 1-243554 | 9/1989 | Japan | 437/183 |

*Primary Examiner*—Olik Chaudhuri
*Assistant Examiner*—Andrew Griffis
*Attorney, Agent, or Firm*—Pollock, Vande Sande & Priddy

[57] ABSTRACT

A method of connecting a TAB tape to a semiconductor chip is disclosed which comprises the steps of preliminarily locating and fixing bumps at positions corresponding to a pattern of electrodes of the semiconductor chip to be connected; and bonding the bumps by thermocompression to the electrodes of the semiconductor chip and the leads of the TAB tape, respectively, so that each electrode of the semiconductor chip is electrically connected to the corresponding lead of the TAB tape through a corresponding one of the bumps. Also disclosed are a bump sheet and a bumped tape to be used in a method of connecting a TAB tape to a semiconductor chip.

9 Claims, 9 Drawing Sheets

F I G. I
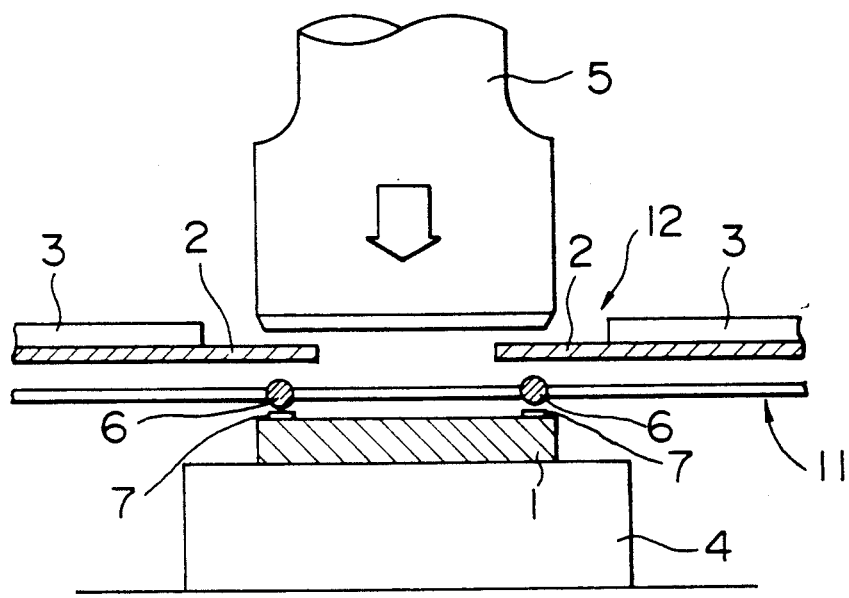
F I G. IA
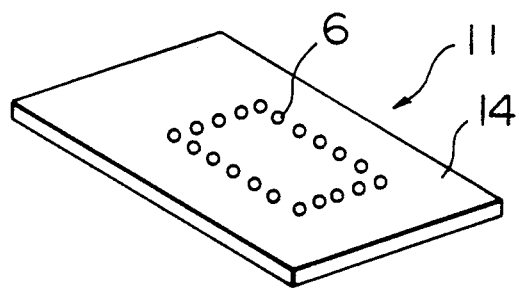

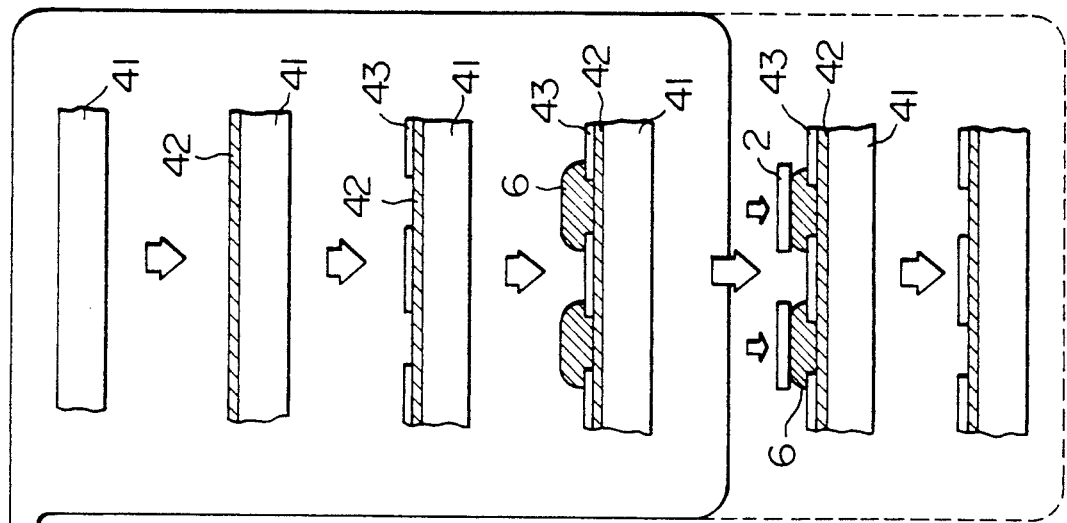
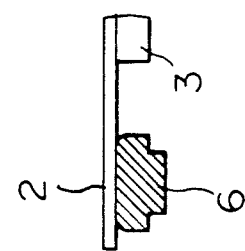
FIG. 13D PRIOR ART
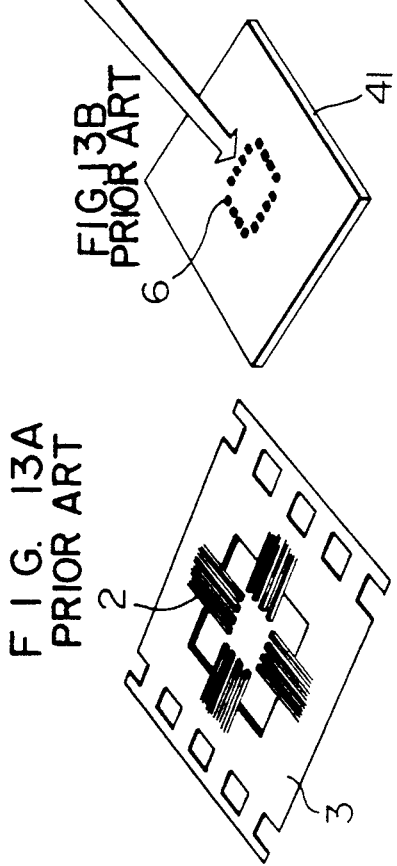
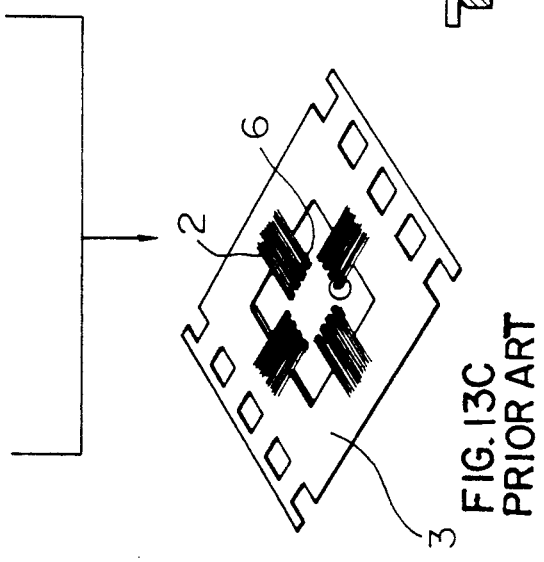

METHOD OF CONNECTING TAB TAPE TO SEMICONDUCTOR CHIP, AND BUMP SHEET AND BUMPED TAPE USED IN THE METHOD

BACKGROUND OF THE INVENTION

1. Field of the Invention

The present invention relates to a method of connecting a semiconductor chip such as IC or LSI to a wiring tape or so-called TAB (Tape Automated Bonding) tape used for connection of the semiconductor chip to a substrate or a lead frame and also relates to a bump sheet and a bumped tape which are used in such a connection method.

2. Description of the Related Art

Conventionally, as a common practice, a semiconductor chip such as IC or LSI is supported by a lead frame and a chip circuit is connected to the lead frame by means of Au bonding wires or the like.

In recent years, however, as semiconductors implement their high performance, a demand for remarkably high density in assemblying has been increased. Namely, as a result of higher density in integration of elements in an integrated circuit and a greater demand for highly developed assembly technique associated therewith, it has followed that the conventional wire bonding technique in wiring of a chip circuit cannot cope with such a demand in many cases.

A TAB system is a bonding method which copes with the above-mentioned recent demand and hence has widely been put to practical use as a method of bonding the electrodes of a semiconductor chip. In a bonding method based on the TAB system, a TAB tape having lead patterns formed in series thereon is used instead of the lead frames used in the wire bonding method and bumps preliminarily formed in either lead portions on the TAB tape or bonding portions on the side of the chip are substituted for the bonding wires. The actual bonding is generally carried out by means of a thermocompression bonding method or the like with the chip and the TAB tape being superposed on each other.

FIG. 12 is a schematic view showing one example of the TAB type of bonding. In the figure, reference numeral 1 designates a semiconductor chip on which a plurality of bumps 6 are preliminarily formed. Numeral 2 designates metallic leads which form a TAB tape 12 together with a tape-like resin film 3. The chip 1 is placed on a bonding stage 4 of a TAB bonder with the bumps 6 upside and the TAB tape is placed above the chip 1. In this state, the bonding is carried out in such a manner that a bonding tool 5 having a proper heat is pressed down from the upside in a direction indicated by arrow.

Usually, the TAB tape used in the above method, is fabricated by providing sproket holes and a device hole in a film made of a synthetic resin such as polyimide or polyester, laminating a metal foil on the film and thereafter forming a lead pattern by means of a photoresist method.

On the other hand, the bumps for connection of the TAB tape and electrodes of the semiconductor chip such as IC or LSI are formed in many cases by applying a plating on Al electrodes of the semiconductor chip, as disclosed by Electronic Parts and Materials, Jul. 1989, p. 71. However, the formation of bumps on the Al electrodes of IC or LSI through the plating method is high in cost and involves a damage of the semiconductor chip circuit during the bump forming work and hence is not necessarily recommended.

Also, as a method of forming bumps on leads on the side of a TAB tape, there is a method disclosed in JP-A-62-28623 or a "transferred bump TAB method" disclosed in National Technical Report, Vol. 31, No. 3, Jun., 1985, pp. 116-124. In the transferred bump TAB method, bumps are preliminarily placed with a predetermined pattern on a glass substrate and are transferred to leads of a TAB tape in which a lead pattern is formed. But, this method, too, involves a complicated work and a problem in cost.

SUMMARY OF THE INVENTION

As have been mentioned above, the conventional TAB system involves the problems that the bump forming method is too expensive, the bump forming work is complicated and there is a possibility of the bump forming work damaging the chip.

A first object of the present invention, in order to solve those problems, is to provide a method of connecting a TAB tape to a semiconductor chip which is simple in work and high in reliability with less probability of the semiconductor chip being damaged.

A second object of the present invention is to provide materials used in the above-mentioned method of connecting the TAB tape to the semiconductor chip, especially, a bump sheet and a bumped tape.

According to one aspect of the present invention, there is provided a method of connecting a TAB tape to a semiconductor chip, comprising the steps of preliminarily locating and fixing ball-like bumps at positions corresponding to a pattern of electrodes of the semiconductor chip to be connected, and bonding the bumps by thermocompression to the electrodes of the semiconductor chip and leads of the TAB tape, respectively, so that each electrode of the semiconductor chip is electrically connected to the corresponding lead of the TAB tape through a corresponding one of the bumps.

According to another aspect of the present invention, there is provided a bump sheet used in a method of connecting a TAB tape to a semiconductor chip, comprising a substrate made of a synthetic resin, and ball-like bumps which are made of a metal and are fixed on the substrate at positions corresponding to portions of electrodes of the semiconductor chip to be connected.

According to a further aspect of the present invention, there is provided with a bumped tape comprising a TAB tape made of a synthetic resin and provided with leads arranged correspondingly to an arrangement of electrodes of a semiconductor chip to which the TAB is to be connected, and bumps made of a metal and fixed to respective end portions of the leads, portion of each bump, which portion is to be connected to one of the electrodes of the semiconductor chip when the lead to which the bump is fixed is connected to the one electrode through the bump, having a shape like a part of spherical ball.

BRIEF DESCRIPTION OF THE DRAWINGS

FIG. 1 is a view showing an embodiment of a method of connecting a TAB tape to a semiconductor chip according to the present invention;

FIG. 1A is a perspective view of a bump sheet used in the method shown in FIG. 1;

FIGS. 13A to 13D are views for explaining the conventional method of fabricating a bumped tape.

DESCRIPTION OF THE PREFERRED EMBODIMENTS

Figure 2A:
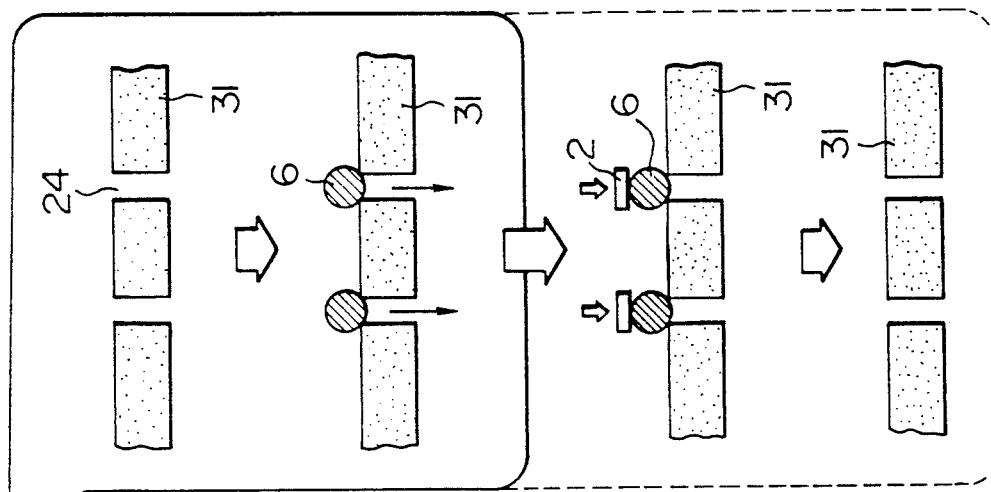
FIGS. 2A to 2D are views for explaining an embodiment of a method of fabrication of a bumped tape according to the present invention.
Figure 2B:
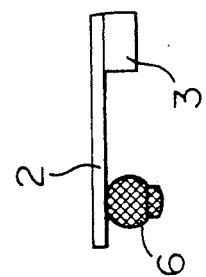
Figure 2C:
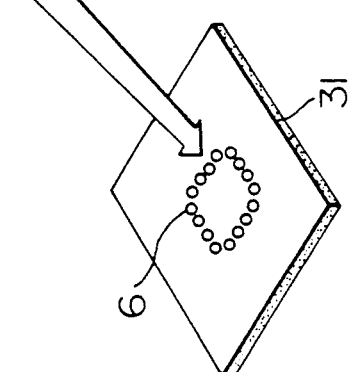
Figure 2D:
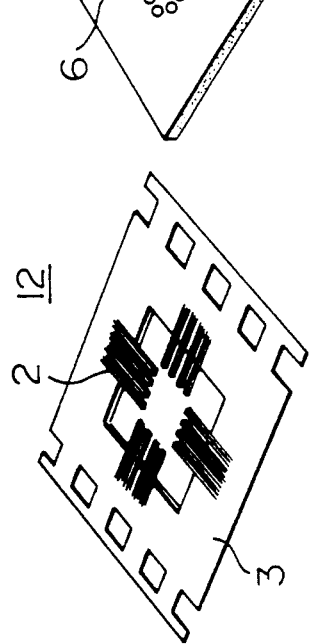

An embodiment of a method of connecting a TAB tape to a semiconductor chip according to the present invention will now be explained with reference to the accompanying drawings.

As a material of bumps in the present invention is used a ball-like (or spherical) or massive (or block) electrically conductive material such as gold, aluminum or copper having a uniform particle size or diameter. The bumps are preliminarily arranged at positions corresponding to the end portions of leads of a TAB tape and thereafter fixed by a tape-like resin film so that the bump arrangement is not disturbed. A resin tape having the bumps arranged at proper positions is called a bump sheet.

The bump sheet is fabricated by the following method. Polyester, polyimide or the like is suitable as the material of a resin film 14 (see FIG. 1A) in which bumps are to be fixed. Bumps are fixed in a tape-like film preliminarily made of such a resin in a predetermined arrangement. As an alternative method, a bump sheet can be fabricated in such a manner that bumps are arranged and provisionally fixed on a mold or substrate, a solution of the above-mentioned resin is poured in the mold and solidified to a predetermined thickness and the solidified resin is peeled off together with the bumps from the mold. In the case of the latter method, there is a possibility that the solution of resin may cover portions of the bumps to be bonded which should be exposed. In such a case, it is required that a solvent such as an alkali solution is used to dissolve the resion on surface portions of the bumps, thereby exposing metal surfaces.

Next, an example of a specific method of bonding a semiconductor chip to leads 2 on a TAB tape 12 by use of the bump sheet thus fabricated will be explained with reference to FIG. 1. A bump sheet 11 fabricated by the above-mentioned method includes a synthetic resin film 14 having bumps 6 arranged at predetermined positions, as shown in FIG. 1A. The bump sheet 11 is inserted in an accurately registered condition between a semiconductor chip 1 placed on a bonding stage 4 and lead portions 2 of a TAB tape 12. By subjecting the resultant assembly in such a state to thermocompression bonding by a bonding tool 5, electrodes 7 of the semiconductor chip 1 and the leads 2 are bonded to each other through the bumps 6 fixed on the bump sheet 11. A heating temperature in the thermocompression bonding is 350° C. to 550° C. and a pressure thereof is 10 to 50 g/lead. For the purpose of the bonding, the existing TAB bonder can be used as it is.

In the embodiment shown in FIG. 1, the bonding between the leads and the bumps and the bonding between the bumps and the semiconductor chip are carried out en bloc. However, in the case where the attainment of both the positional setting between the leads and the bumps and the positional setting between the bumps and the semiconductor chip is difficult in relation to positional registration or the like, the connection of the leads and the bumps and the connection of the bumps and the semiconductor chip may be carried out separately or in two steps. Namely, the bumps and the leads are first bonded with the TAB tape and the bump sheet being superposed in registration with each other and then the bumps and the electrodes of the semiconductor chip are bonded while positioning them in registration or the order of the above two steps of bonding may be inverted.

Next, explanation will be made of examples of the fabrication of a bump sheet and the connection of a TAB tape and a semiconductor chip using the bump sheet.

EXAMPLE 1

Gold having a purity of 99.99% or more was used to form balls having a mean diameter of 80 $\mu$m, thereby providing bumps. The bumps were obtained by cutting a wire of 25 $\mu$m diameter made of a bump forming metal (gold in the shown example) into fragments of a predetermined length and heating the wire fragments upto a temperature higher than a melting point while separating them from each other so as to allow them to take spherical or ball shapes by virtue of the action of surface tension of the metal. The length of each wire fragment was selected such that the diameter of its ball-shaped version is 80 $\mu$m. The diameters of the actually formed balls falled within a range of 75 to 85 $\mu$m.

Figure 3A:
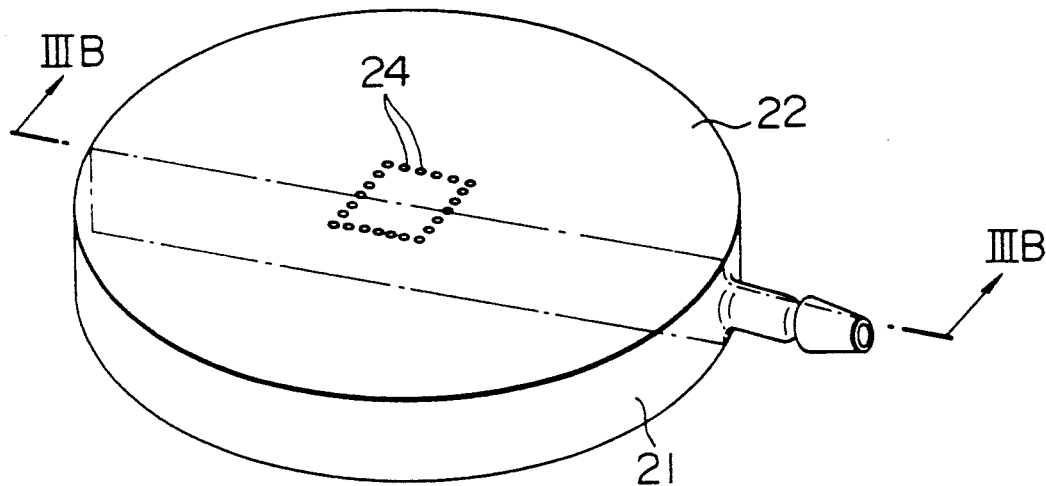
FIGS. 3A and 3B are views showing the structure of a jig used for fabricating the bump sheet shown in FIG. 1A and the bumped tape shown in FIG. 2.
Figure 3B:
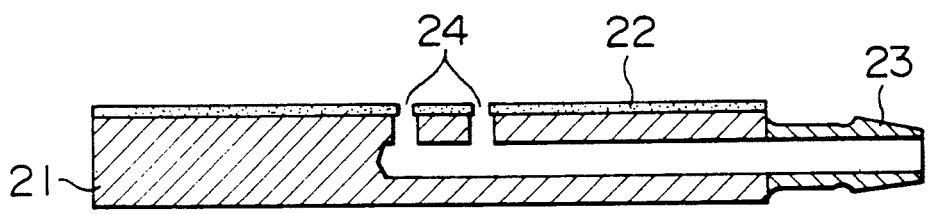

A bump sheet including such bumps arranged in registration with the positions of inner leads of a 200-pin TAB tape was fabricated by use of a jig as shown in FIGS. 3A and 3B. Namely, a thin stainless steel plate 22 formed with through-holes 24 having a diameter of 70 $\mu$m slightly smaller than that of the metal bump ball at positions corresponding to the inner leads of the TAB tape was placed on the upper surface of a vacuum box 21 having a cross section as shown in FIG. 3B and the bumps were distributed on the thin plate 22 while sucking the air in the vacuum box by means of a vacuum pump (not shown) connected to a suction hole 23.

Thereby, the bumps were attracted to the positions of the through-holes 24 so that they are provisionally fixed at those positions. Next, a solution of polyimide dissolved in a solvent was poured to cover the thin plate 22 and solidified to a form of a bump sheet shown in FIG. 1A. The thickness of the polyimide film was 40 μm. After the polyimide was completely solidified, it was peeled off from the thin plate 22, thereby obtaining a bump sheet which has the bumps fixed at predetermined positions.

The thus fabricated bump sheet was placed under a 200-pin TAB tape including inner leads having the same arrangement as the bumps in the bump sheet in a registration with each other, and a 200-pin Si chip was placed under the bump sheet. In such a state, the assembly was subjected to a batch thermocompression bonding by use of a TAB bonder the conditions of the thermocompression bonding were 350° C. and 2 seconds.

The pull strength was examined after the bonding. Any one of the pins was cut at the lead portion of the TAB tape. Namely, it was confirmed that the bonding has a sufficient strength.

EXAMPLE 2

Balls having a mean diameter of 90 μm (87 to 93 μm in measured values) were produced using gold of 99.99% purity as a raw material. Holes of 80 μm diameter were preliminarily provided at predetermined positions of a polyethylene sheet of 40 μm thickness by means of a laser and the gold balls heated to a certain degree were pushed into the holes. The gold balls were fixed at a central portion of the sheet, thereby forming a bump sheet.

The thus formed bump sheet was bonded by thermocompression to inner leads of a TAB tape and was thereafter bonded again by thermocompression to Al electrodes of a semiconductor chip. The bonding properties of both the bonding portions were satisfactory.

Since a tape (or bump tape) having bumps for connection preliminarly arranged at predetermined positions is fabricated and used for connecting a TAB tape to a semiconductor chip, as mentioned above, it is possible to establish a TAB assemblying technique which is very low in possibility of the chip being damaged unlike the conventional method of forming bumps at electrodes of the chip and hence excellent in workability and low in cost.

In the foregoing, the TAB tape and the semiconductor chip have been connected by use of the bump sheet. However, in order to simplify the connecting process, it is preferable to use a bumped tape in which a TAB tape and a bump sheet are integrated. As has already been mentioned, the "transferred bump TAB method" proposed by the National Technical Report, Vol. 31 No. 3 (1985), pp. 116-124 is known as a method of fabricating a bumped tape. This method will now be explained with reference to FIG. 13.

A TAB tape includes leads 2 formed on a base film 3. This TAB tape may be one which is fabricated by a usual method as will be mentioned in later. In the "transferred bump TAB method", bumps are fixed to the TAB tape as follows. As shown in FIG. 13, an electrically conductive metal 42 is uniformly deposited through an electroless plating method, a sputtering method or the like on a substrate 41 such as a glass plate. Next, a surface of the deposited metal 42 other than portions where bumps are to be formed is masked by an insulator 43. A gold plating is conducted in this state so that gold is deposited on the portions which are not masked by the insulator 43, thereby forming bumps 6. The thus formed bumps 6 are heated and pressed while positioning them in registration with the end portions of leads 2 of the TAB tape so that the bumps are transferred to the end portions of the leads 2.

According to the above method, it is generally possible to prevent a semiconductor chip from being damaged in the process of formation of bumps. Further, it is said that there is a merit that the cost for fabrication of a bumped tape is low since the bump forming substrate can be used repeatedly. In this method, however, the bump forming work itself is complicated, as is apparent from the process steps shown in FIG. 13. Also, since the bump forming substrate is damaged more and more progressively with the repeated use thereof, careful management of the substrate is required in order to always form satisfactory bumps. Further, since the bumps are once subjected to deformation when they are transferred from the bump forming substrate to the leads and the deformed bump portions are necessarily bonded to the semiconductor chip, it involves a problem that the bonding is made with less reliability and/or less stability. Moreover, since the bumps are formed by plating, there is a great restriction in that the composition and shape of the bump cannot be selected freely. Especially, as to the composition of the bump, though an alloy added with a special element is superior to pure gold in many cases where the property of bonding between the pads or electrodes of a semiconductor chip and the bumps is especially important, it is not possible to form such special-alloy bumps by the conventional method using the plating technique.

As regards the fabrication of a TAB tape itself, a variety of methods have already been established and good products are supplied. A two-layer tape and a three-layer tape are especially very useful among them. A difference between the two-layer and three-layer tapes is as follows. Namely, the two-layer tape is one in which a metal (copper in many cases) is plated on a film base of the tape, so as to form a lead pattern directly. On the other hand, the three-layer tape is one in which a metal foil is covered on a film base through an adhesive and a lead pattern is thereafter formed by etching. A synthetic resin such as polyimide or polyester is used as a base film of the TAB tape. Also, a product of such a film having sproket holes and a device hole preliminarily formed therein is available as a base film for a TAB tape.

A bumped tape according to the present invention is fabricated in such a manner that preliminarily prepared ball-like bumps are provisionally arranged on a substrate at positions corresponding to electrodes of a semiconductor chip. The substrate and a TAB tape are thereafter superposed in positional registration with each other and then the bumps provisionally arranged on the substrate are transferred to the end portions of leads of the TAB tape. Therefore, portions of the bumps to be bonded to the semiconductor chip are subjected to no deformation so that each bump keeps substantially its original spherical or ball shape. As a result, satisfactory bonding to the semiconductor chip is attainable.

A method of fabrication of a bumped tape according to the present invention will now be explained with reference to FIG. 2.

A TAB tape may be any of an existing two-layer or three-layer TAB tape in which a predetermined pattern of leads 2 is formed on a base film 3. A substrate 31 which may be a thin sheet made of stainless steel is prepared for providing an array of bumps. Recesses or through-holes meeting to the sizes of ball-like bumps are provided in the substrate 31 at positions corresponding to leads of the TAB tape. By dropping the bumps into the respective recesses or through-holes, the bumps are arranged at predetermined positions. The used ball-like bumps are formed in a similar manner to the formation of bumps used for fabrication of a bump sheet as mentioned above. The material and size of the bump are properly selected in accordance with the material components of a TAB tape and a semiconductor chip to be connected.

The TAB tape and the substrate having the bumps thus arranged at the predetermined positions are superposed one another positional registration with each other such that the bumps of the substrate and the lead end portions of the TAB tape are aligned with each other. Then, the bumps are heated and pressed at a temperature of 350° to 550° C. under a pressure of 10 to 50 g/lead so that the bumps are transferred to the end portions of the leads. At this time, a portion of the bump to be bonded to the lead is subjected to deformation due to the pressing but a head portion thereof to be bonded to the electrode of the semiconductor chip is not substantially subjected to deformation or maintains its original soft ball shape. Therefore, satisfactory bonding to the semiconductor chip is attainable.

Like the case of the existing bumped tape, the fabricated bumped tape and the semiconductor chip are superposed one another with the bumps and the electrodes of the semiconductor chip being in positional registration with each other and are bonded by a thermocompression bonding method or the like.

Next, various examples of the fabrication of a bumped tape will be explained in detail.

EXAMPLE 3

A vacuum box 21 shown in FIG. 3A was attached on a bonding stage of a TAB bonder. A thin stainless steel plate 22 of 0.1 mm thickness is detachably mounted on the upper surface of the vacuum box 21 and the interior of the vacuum box 21 is adapted to be pressure-reduced by a vacuum pump (not shown) connected to a suction hole 23.

Figure 4A:
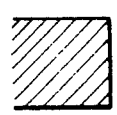
FIGS. 4A to 4D are views showing various shapes of a bump arranging through-hole provided in a plate of the jig shown in FIG. 3A.

The stainless steel plate 22 of 0.1 mm thickness, which serves as a bump forming substrate, includes through-holes 24 the number of which is 200 in total, each of which has a diameter of 70 μm and which are formed by etching at positions in registration with the bump positions of inner leads of a 200-pin TAB tape. The cross section of the through-hole was a simple shape as shown in FIG. 4A. A multiplicity of balls having a mean diameter of 80 μm and made of gold having a purity of 99.99% were distributed on an upper surface of the bump forming substrate while pressure-reducing lower part under the substrate. At this time, ultrasonic oscillation was applied to one end of the substrate so that the gold balls were trapped into the through-holes. Thereafter, excess gold balls remaining on the substrate were readily blown away by air.

Next, a TAB tape was superposed on the substrate in positional registration with each other and was pressed and heated by means of a bonding tool (not shown), thereby transferring the gold balls arranged on the substrate to the end portions of leads of the TAB tape. It was possible to repeatedly use the substrate, on which gold balls were distributed again.

Figure 5:
FIG. 5 is a view showing a shape of a bump secured to each lead of a bumped tape fabricated by the method shown in FIG. 2.

The bump transferred to the lead end portion was deformed into a shape having a cross-section as shown in FIG. 5A as the result of the transfer process. However, the tip of the bump maintains its spherical ball shape convenient for bonding to the semiconductor chip.

EXAMPLE 4

Figure 4B:
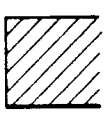

A thin stainless steel plate 22 on the upper surface of the vacuum box 21 shown in FIG. 3A was prepared with through-holes, each having a cross section as shown in FIG. 4B. Such inclined or tapered through-holes were obtained by laser beam machining. The interior of the vacuum box 21 was pressure-reduced so that ball-like bumps dropped into the through-holes in a similar manner to that in the Example 3.

Next, a TAB tape was superposed on the thin plate or substrate in positional registration with each other and was heated and pressed by means of a bonding tool so that the gold balls arranged on the substrate were transferred to the end portions of leads of the TAB tape. In the case of the present example, since the through-hole of the substrate is tapered, there is a possibility that the peeling of the leads to which the bumps have been transferred from the substrate is easy and hence the possibility of the leads being deformed is less. The cross section of the bump as transferred is not substantially different from that in the Example 3. Bonding to a semiconductor chip was carried out with a very good result.

EXAMPLE 5

Balls having a diameter of 40 μm were produced by use of an alloy of low-melting temperature containing 88% of gold and 12% of germanium.

Figure 4C:
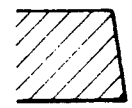

A vacuum box similar to that in the Example 3 was used and a substrate on the vacuum box was provided with through-holes each having a cross-sectional shape as shown in FIG. 4C. The through-hole was produced by forming a concave recess in an upper surface of the substrate by use of a punch having a trigonal pyramid head and thereafter irradiating a bottom portion of the recess with a laser beam. The size of the through-hole was determined such that the maximum diameter portion at the upper side of the through-hole was about 30 μm.

Figure 4D:
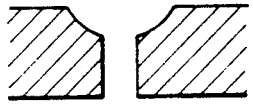

After the gold-germanium alloy balls were distributed on the substrate, of which the inner chamber was pressure-reduced so that they were trapped into the through-holes, a TAB tape was superposed on the substrate in positional registration with each other and the bumps were transferred to the end portions of leads of the TAB tape by means of a bonding machine. In the present example, the pulling-up of the leads after the transfer of the bumps thereto was much easier as compared with the case of the Example 4. In the case where the affinity between the bump forming substrate and the bumps is so strong due to a compositional relation therebetween that the pulling-up of the leads having the bumps as transferred from the substrate is difficult, the provision of the substrate through-holes shaped as in the present example is convenient. Also the through-holes having cross-sectional shapes as shown in FIG. 4D, provide substantially the same effect as that in the present example.

EXAMPLE 6

Like the Example 4, a thin stainless steel plate 21 on an upper surface of a vacuum box shown in FIG. 3A was formed with through-holes having cross-sectional shapes as shown in FIG. 4B. A soft rubber tube was coupled to a suction hole of the vacuum box so as to allow the vacuum box to freely move in a state that the interior of the vacuum box is pressure-reduced.

In addition to the thin plate or substrate, a flat plate was prepared. Ball-like gold bumps were randomly distributed on the flat plate. The vacuum box was brought in proximity to the gold bumps on the flat plate in a state the vacuum box is turned over with the substrate down side, so that the bumps are attracted to the through-holes as pressure-reduced. Next, the vacuum box having the bumps attracted thereto was again turned over and fixed on a bonding stage of a TAB bonder. A TAB tape was superposed on the substrate of the vacuum box in positional registration with each other and the bumps were transferred to lead portions of the TAB tape.

In the case of the present example, since bumps are attracted to only the through-holes of the substrate from the beginning, an operation of blowing away excess bumps on the substrate was unnecessary.

EXAMPLE 7

Figure 6A:
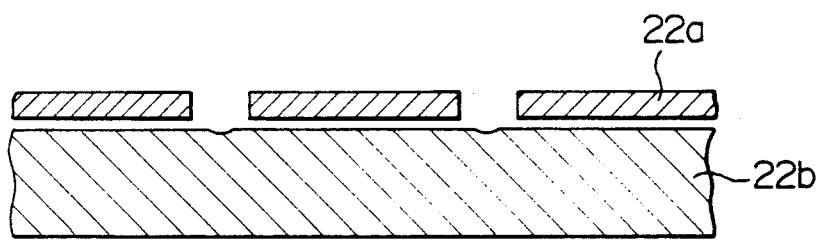
FIGS. 6A to 6D are views showing the structure of another jig which is used for provisionally arranging bumps at regular positions in a method of fabricating a bumped tape.

In the present example, no vacuum box was used but a bump forming substrate of a double structure having a cross section as shown in FIG. 6A was used. An upper substrate 22a, made of a stainless steel plate having a thickness of 50 μm was provided with through-holes of an inner diameter of 100 μm slightly larger than the diameter 80 μm of ball-like gold bumps 6 at positions corresponding to a pattern of electrodes of a semiconductor chip. A lower substrate 22b made of a stainless steel having a thickness of 200 μm was provided on its surface with disk-shaped recesses of 10 μm depth at positions corresponding to the through-holes of the upper substrate.

Figure 6B:
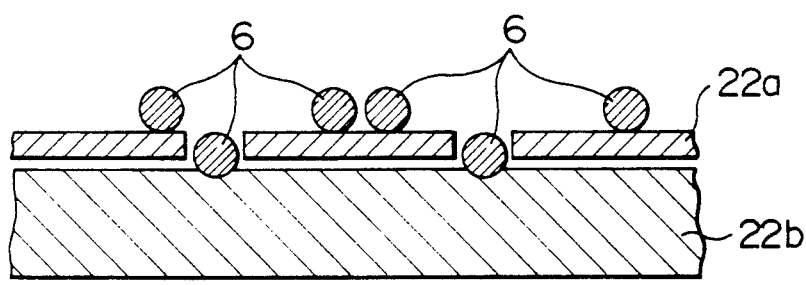
Figure 6C:
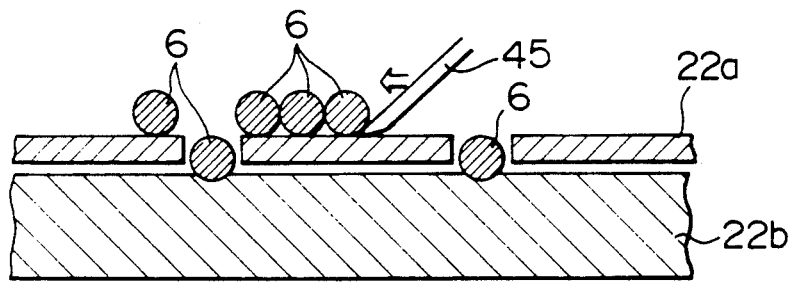

The two substrates were superposed with two stainless steel plates or spacers (not shown) of 20 μm thickness being interposed between the opposite edges of the two substrates so that a gap of about 20 μm is formed between the two substrates, as shown in FIG. 6A. The bumps were distributed on the substrate 22a and ultrasonic oscillation was applied to drop the bumps into the through-holes of the substrate 22a. The dropped bumps were supported by the recesses of the lower substrate 22b, as shown in FIG. 6B. But excess bumps, which were not trapped into the through-holes, were left on the substrate 22a. Therefore, a sweeping plate 45 was let run on the upper surface of the substrate 22a to remove the excess bumps, as shown in FIG. 6C.

Figure 6D:
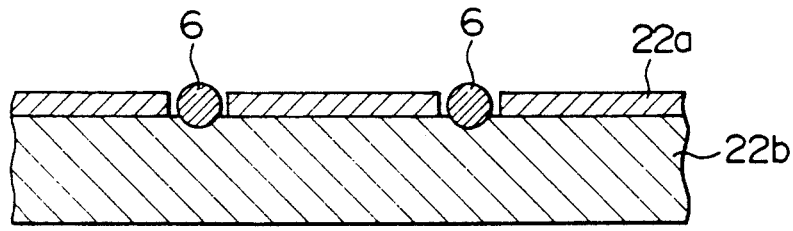

Next, the spaces were removed and the substrate 22b was moved upward until the gap between the substrates 22a and 22b disappears. Thereby, the bumps were provisionally positioned regularly with the upper portion of each bump being protruded by about 20 μm from the upper surface of the substrate 22a, as shown in FIG. 6D. Leads of a TAB tape were superposed on the provisionally arranged bumps in positional registration with each other and then the bumps were transferred to the end portions of the leads, in a similar manner to the foregoing examples, thereby fabricating a bumped tape.

According to the present example, since no pressure reduction by a vacuum equipment or the like is not required, the workability is more facilitated. Further, since the substrate to which a pressure is applied by a bonding tool when bonding can be made as thick as possible (200 μm in the present example), a fabricating equipment having a durability can be provided.

EXAMPLE 8

Balls having a mean diameter of 80 μm were produced as bumps by use of gold having a purity of 99.99% or more. The diameters of the actual balls were within a range of 75 to 85 μm.

Figure 7:
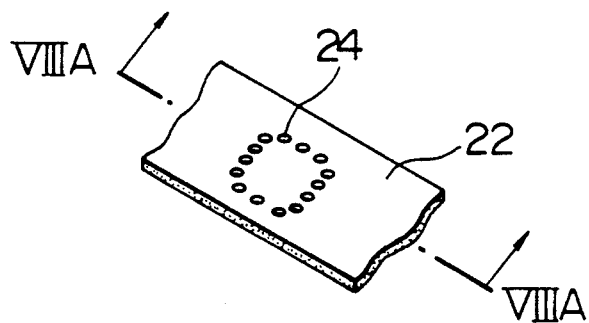
FIG. 7 is a view showing a substrate used in another embodiment of a method of fabrication of a bumped tape according to the present invention.
Figure 8A:
FIGS. 8A to 8E are views showing a method of fabricating a TAB tape by use of the substrate shown in FIG. 7.
Figure 8B:
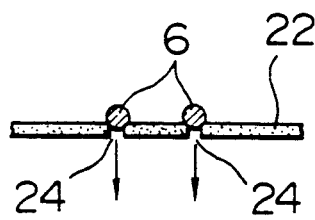
Figure 8C:
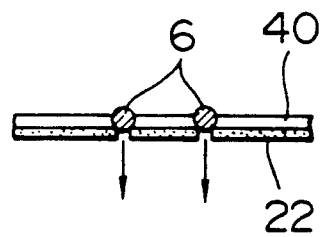
Figure 8D:
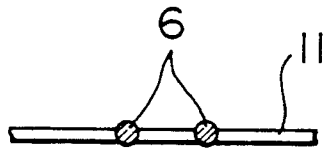

The gold bumps were arranged at positions meeting the positions of inner leads of a 200-pin TAB tape. The arrangement was carried out in a manner as explained below with reference to FIGS. 7 and 8A to 8E. There was prepared a mold substrate 22 (see FIG. 7) made of a thin stainless steel plate and formed with through-holes 24 having a diameter of 70 μm slightly smaller than the diameter of the gold balls at positions corresponding to the inner leads of the TAB tape. FIG. 8A shows a cross section taken along line VIII—VIII of FIG. 7. The through-holes 24 of the substrate 22 were sucked from the lower side by means of a vacuum pump so that the bumps 6 were attracted to and provisionally fixed at the positions of the through-holes, as shown in FIG. 8B. Next, a solution of polyimide dissolved by a solvent was poured and solidified, as shown in FIG. 8C, so that the thickness of the polyimide film 40 after solidification becomes 40 μm. After the polyimide was completely solidified, it was peeled off from the mold, thereby obtaining a bump sheet 11, as shown in FIG. 8D, in which the bumps 6 were fixed at predetermined positions.

In the obtained bump sheet, a surface of the bump (especially, the upper side thereof) was partially coated with polyimide. Therefore, the surface was lightly etched by means of caustic soda to expose a metal surface of the top portion of the bump.

Figure 8E:
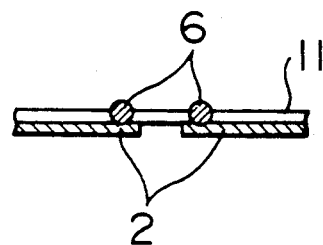

Next, a pattern of leads 2 having a thickness of about 30 μm were formed directly on one surface of the bump sheet by means of copper-plating, as shown in FIG. 8E, thereby completing a bumped tape.

This bumped tape was placed in positional registration with a semiconductor chip having 200 electrodes in the same arranged as the leads of the TAB tape and the assembly was subjected to thermocompression bonding by a TAB bonder. The bonding conditions were such that the temperature is 350° C., the pressure is 30 g/lead and the time is 2 seconds.

The pull strength was examined after bonding and it was confirmed that any one of the pins is cut at the inner lead portion of the TAB tape and hence the bonding has a sufficient strength.

Figure 11A:
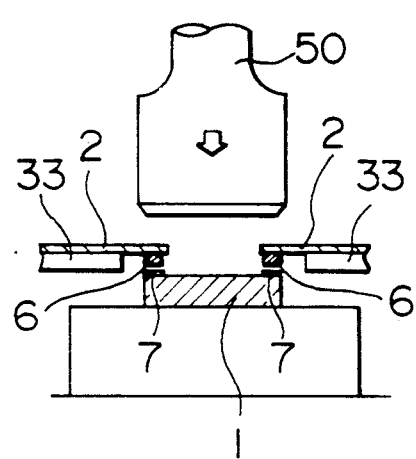
FIGS. 11A to 11D are views showing various manners, for comparison, in which the bumped tape of prior art and that of the present invention are each connected to a semiconductor chip.
Figure 11B:
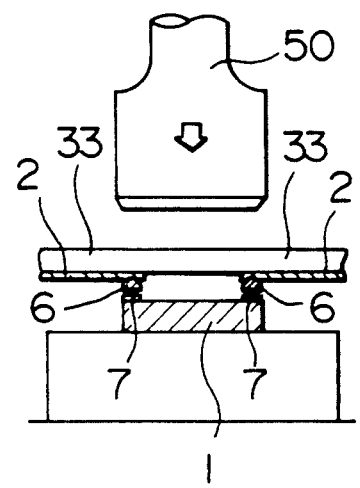

A usual TAB tape is fabricated such that a portion of the tape where a semiconductor chip is to be located is bored in the form of a window as a device hole and only the end portions of leads extends into inside of the device hole. The bonding of the usual TAB tape to the semiconductor chip is carried out, as shown in FIG. 11A. In the figure, reference numeral 2 designates leads, numeral 33 a base film of the TAB tape, numeral 1 the semiconductor chip, numeral 6 bumps, and numeral 50 a bonding tool. In the arrangement as shown in FIG. 11A, the bonding is impossible unless the device hole is provided. In the case where no device hole is formed in conventional bumped tape, the bonding is carried out, as shown in FIG. 11B. In that case, however, no practical bonding is effected since a heated bonding tool contacts directly a base film of the tape so that there are encountered inconveniences due to the burning of the film resulting in the deterioration of an insulating ability thereof and the contamination of the bonding tool surface.

As apparent from the above, a device hole is indispensable to the conventional bumped tape. Therefore, in the case of a two-layer type tape, a device hole is bored by etching a film after leads have been formed. In the case of a three-layer tape, a device hole is preliminarily bored together with sprocket holes by means of punching or the like prior to the formation of leads.

Figure 11C:
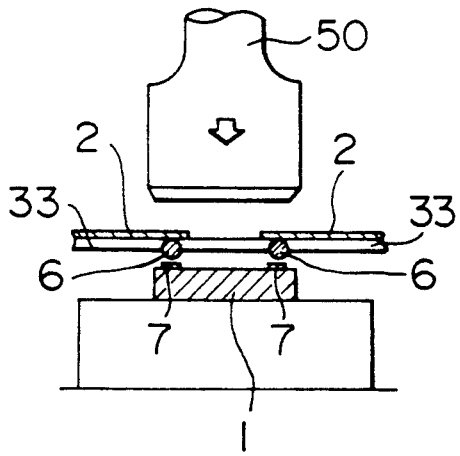

In the case of a bumped tape according to the present invention, bumps are provided to extend into a base film. Therefore, as understood from FIG. 11C, even if a tape having no device hole bored therein is used as it is, there is no possibility that a bonding tool of a bonder contacts directly a film. In other words, a step for formation of a device hole can be omitted from a tape fabricating process. This is one additional merit showing that the workability of a method according to the present invention is excellent.

EXAMPLE 9

Balls having a mean diameter of 90 $\mu$m (87 to 93 $\mu$m in measured values) were produced using gold of 99.99% purity as a raw material. 80 $\mu$m holes were bored in a polyimide film of 40 $\mu$m thickness by a laser at positions corresponding to the positions of the electrodes of a 200-pin semiconductor chip. The gold balls were fixed into the holes. The fixing method will now be explained by using FIGS. 9 and 10A to 10F.

Figure 9:
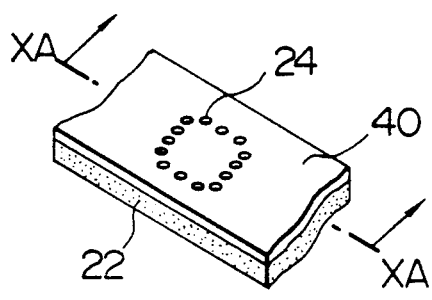
FIG. 9 is a view showing a substrate and a synthetic resin film used in a further embodiment of a method of fabrication of a bumped tape according to the present invention.
Figure 10A:
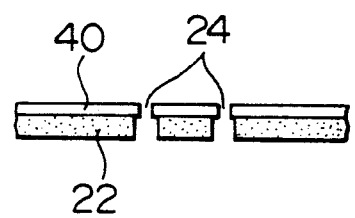
FIGS. 10A to 10F are views showing a method of fabricating a TAB tape by use of the substrate shown in FIG. 9.
Figure 10B:
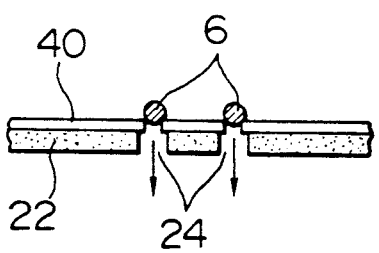
Figure 10C:
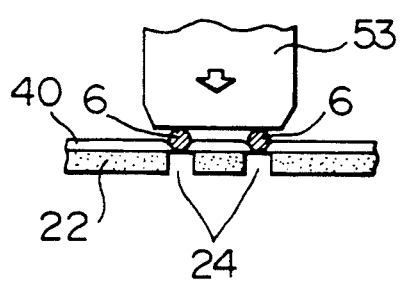
Figure 10D:
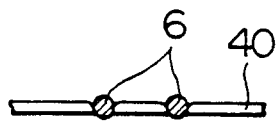

First, as shown in FIG. 9, there was prepared a substrate including a pile of a polyimide film 40 formed with holes at positions where the gold balls are to be arranged and a thin stainless steel plate 22 which is placed on the rear side of the film 40 and provided with holes formed at the same positions as those formed in the film 40. FIG. 10A shows a cross section taken along line XA—XA of FIG. 9. As shown in FIG. 10B, the rear side of the tin stainless steel plate 22 was evacuated so that the gold balls 6 are attracted to the hole positions of the polyimide film 40. Next, as shown in FIG. 10C, the gold balls were mechanically pushed from the front side of the film 40 into the holes of the plate 22 by means of a press 53 so that the head portions of the balls were protruded by about 5 $\mu$m from the opposite surface of the tape. In this manner, a bump sheet as shown in FIG. 10D was obtained in which the gold bump was fixed or positioned asymmetrically with respect to the tape surface.

Figure 10E:
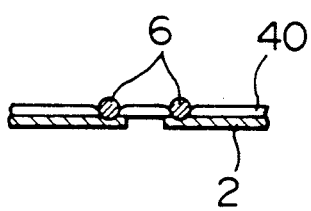
Figure 10F:
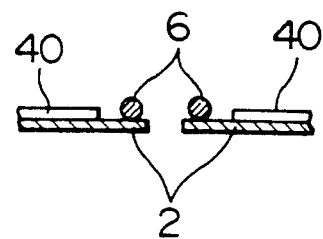

Next, one surface of this bump sheet or the sheet surface on the side having the bumps protruded by about 5 $\mu$m therefrom was copper-plated to form leads 2 in a predetermined pattern, as shown in FIG. 10E. The thickness of the copper plating was in order of 30 $\mu$m. Thereby, the gold bumps and the copper leads were integrated with good electrical conductivity therebetween as well as a mechanical bonding having a certain degree of strength. As shown in FIG. 10F, a device hole in the form of window was etched in the tape at a central portion of the bump sheet for locating there a semiconductor chip to be connected. Thereby, a bumped tape was obtained in which the end portions of the leads were extending inside of the device hole and the ball-like gold bumps were secured to the end portions of the leads.

The bumped tape fabricated by the above-mentioned method was used to conduct the test of connection or bonding to a semiconductor chip. The thermocompression bonding conditions were such that the pressure was 35 g/lead, the temperature was 450° C. and the time was 1 second. As the result of examination of the pull strengths of the lead bonding portions, any one was cut at the lead portion. This shows that the bonding between the leads and the bumps as well as the bonding between the bumps and the semiconductor chip were satisfactory.

Figure 11D:
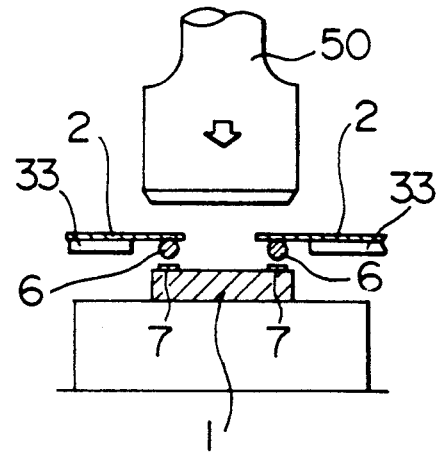
Figure 12:
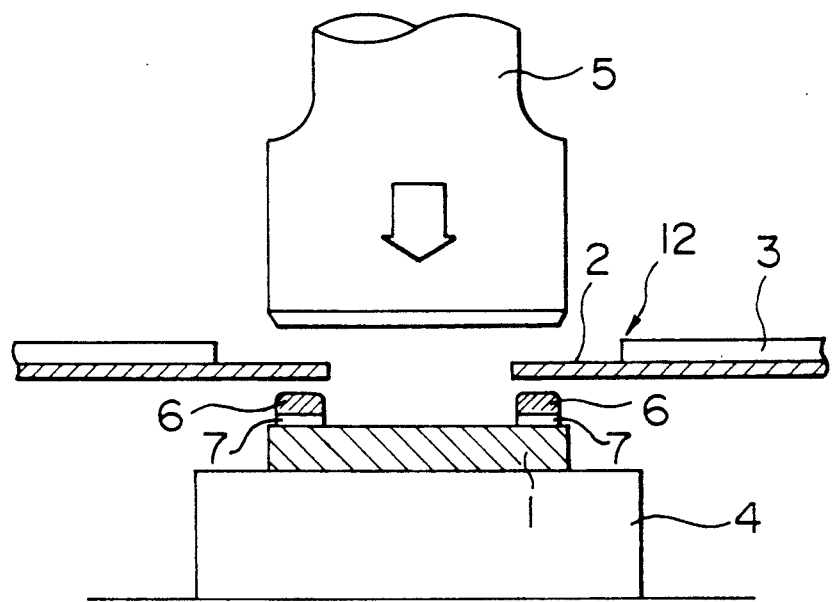
FIG. 12 is a view showing the conventional method of connecting a TAB tape to a semiconductor chip.

In the present example, a device hole was formed in a portion of the tape for locating there the semiconductor chip to be connected, like the case of the conventional bumped tape fabricated by the "transferred bump TAB method". In the present example, though an additional step of forming the hole is required, the bonding can be conducted in a manner as shown in FIG. 11D. Therefore, the heating conditions for bonding can be selected freely, thereby making it possible to realize more satisfactory bonding. Also in the case of the present example, since the bump has a ball-like shape, there was confirmed a merit that the bumps encounter a very smooth contact with electrode portions of the semiconductor chip upon actual bonding so that no excessive load is imposed upon the chip.

EXAMPLE 10

Holes of 80 $\mu$m diameter were bored in a polyester film tape of 40 $\mu$m thickness and gold balls of 99.99% purity having a mean diameter of 90 $\mu$m were pushed into the holes. The gold balls were arranged on the tape at positions corresponding to the electrodes of a 100-pin semiconductor chip to be connected thereto. The gold balls were fixed on the tape in the same method as the Example 9. Namely, the gold balls were fixed such that each ball is protruded by about 5 $\mu$m from one surface of the tape and by about 45 $\mu$m from the opposite surface thereof.

Next, on the one surface of this bump sheet or the sheet surface having the bumps protruded by about 5 $\mu$m therefrom, a copper foil of 35 $\mu$m thickness was fixed by means of an adhesive. Though the head of the bump is slightly protruded, this involved no hindrance to the adhesion of the copper foil. This copper foil was etched to form a pattern of leads corresponding to the positions of electrodes of a 100-pin semiconductor chip. Thereafter, the base film was etched to form a device hole, thereby fabricating a bumped tape.

In the case of the present example, it does not always provide a satisfactory bonding between the bumps and the leads made in the above fabricating process.

However, when a semiconductor chip has been bonded to the leads of a bumped tape fabricated by the above process, the bonding between the bumps and the leads becomes satisfactory to attain sufficient electrical/mechanical bonding properties.

We claim:

1. A method of connecting a TAB tape to a semiconductor chip comprising the steps of:
   preliminarily locating and fixing substantially spherical bumps at positions corresponding to a pattern of electrodes of the semiconductor chip to be connected; and
   bonding the bumps by thermocompression to the electrodes of the semiconductor chip and the leads of the TAB tape, respectively, so that each electrode of the semiconductor chip is electrically connected to the corresponding lead of the TAB tape through a corresponding one of the bumps.

2. A method according to claim 1, wherein said bumps are arranged and fixed on a substrate of a synthetic resin film at positions corresponding to the pattern of electrodes of said semiconductor chip.

3. A method according to claim 1, wherein said bumps are located on a substrate of a synthetic resin film at positions corresponding to the pattern of electrodes of said semiconductor chip and fixed by transferring the bumps from said substrate to portions of the leads of said TAB tape which are to be connected to the electrodes of said semiconductor chip.

4. A method according to claim 1, wherein said bumps are fixed in a form of a bump sheet by arranging the bumps on a substrate of a synthetic resin film at Positions corresponding to the pattern of electrodes of said semiconductor chip and the leads of said TAB tape are formed in a predetermined pattern on one surface of said synthetic resin film of said bump sheet in an electrically conducting relation with said bumps.

5. The method of claim 1 wherein said electrodes are aluminum electrodes.

6. The method of claim 1 wherein said bumps are made of metal.

7. The method of claim 1 wherein said bumps are made of a metal selected from the group consisting gold, aluminum and copper.

8. The method of claim 2 wherein said synthetic resin is a polyester or polyimide.

9. The method of claim 1 wherein said thermocompression is carried out at a temperature of 350° C. to 550° C. and pressure of 10 to 50 g/lead.

* * * * *